(12) United States Patent
Dent

(10) Patent No.: US 6,233,436 B1
(45) Date of Patent: May 15, 2001

(54) INTERMODULATION COMPENSATION IN MULTI-CHANNEL AMPLIFIERS

(75) Inventor: Paul W. Dent, Pittsboro, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/328,903

(22) Filed: Jun. 9, 1999

Related U.S. Application Data

(62) Division of application No. 08/764,877, filed on Dec. 16, 1996, now Pat. No. 5,933,766.

(51) Int. Cl.[7] .................................................. H04B 17/00
(52) U.S. Cl. .............................................................. 455/115
(58) Field of Search ............................ 455/12.1, 15, 17, 455/19, 25, 63, 91, 115, 101, 102, 103, 67.1, 226.1; 375/295, 296; 330/124 R, 151, 295

(56) References Cited

U.S. PATENT DOCUMENTS

| 3,917,998 | 11/1975 | Welti | 455/25 |
| 4,868,520 | 9/1989 | Terakawa et al. | 330/295 |
| 4,901,085 | 2/1990 | Spring et al. | 455/12.1 |
| 5,144,642 | 9/1992 | Weinberg et al. | 455/226.1 |
| 5,568,088 | 10/1996 | Dent et al. | 455/127 |
| 5,574,967 | 11/1996 | Dent et al. | 455/12.1 |
| 5,574,980 | 11/1996 | Nomura | 455/103 |
| 5,933,766 | 8/1999 | Dent | 455/115 |

FOREIGN PATENT DOCUMENTS 725 477  8/1996  (EP) .

OTHER PUBLICATIONS

K. Yamamoto et al., "High Output Port Isolation and Low Intermodulation Distortion Multi–Port–Amplifier," *Proceedings of the European Microwave Conference*, Finland, Aug. 24–27, 1992, pp. 1137–1142.

*Primary Examiner*—Thanh Cong Le
(74) *Attorney, Agent, or Firm*—Burns, Doane, Swecker & Mathis, L.L.P.

(57) ABSTRACT

A multi-channel transmit amplifier array comprising a multiplicity N of coupled power amplifier elements is disclosed. The number of channels provided for amplifying desired signals for transmission is less than N, by at least one. In this case, the unused channel is used to inject an intermodulation compensation waveform specifically tailored to reduce intermodulation generated in all of the other N−1 signal paths. Instantaneous complex waveform values for the intermodulation compensation waveform may be systematically computed from the instantaneous complex values of the N−1 desired signals in such a way as to minimize the greatest signal amplitude in any of the N signal paths.

2 Claims, 12 Drawing Sheets

FIG. 6

| Port No. / Matrix A | 898 | 899 | 900 | 901 | 902 | 903 | 904 | 905 MHz |
|---|---|---|---|---|---|---|---|---|
| 0 | | | IP5 | IP3 | | | | |
| 1 | | | | X | X | IP3 | IP5 | |
| 2 | | | | | | | | |
| 3 | | | | | | | | |

FIG. 7

| Port No. / Matrix A | 898 | 899 | 900 | 901 | 902 | 903 | 904 | 905 MHz |
|---|---|---|---|---|---|---|---|---|
| 0 | IP3 | | | | | | | |
| 1 | | | X | | | | | |
| 2 | | | X | | | | | |
| 3 | IP3 | | | | | | | |
| | IP5 | | | | | | | |

FIG. 8

| Port No. / Matrix A | 898 | 899 | 900 | 901 | 902 | 903 | 904 | 905 MHz |
|---|---|---|---|---|---|---|---|---|
| 0 | | | IP3 | | | IP5 | | |
| 1 | | | | X | | | | IP7 |
| 2 | | IP7 | IP5 | | X | | | |
| 3 | | | | | | IP3 | IP5 | |

FIG. 9

| Port No. / Matrix A | 898 | 899 | 900 | 901 | 902 | 903 | 904 | 905 MHz |
|---|---|---|---|---|---|---|---|---|
| 0 | | | | | | | | I02 |
| 1 | | I30 | I21 | X | | I13 | I32 | |
| 2 | | | | I23 | I01 | X | I03 | |
| 3 | I20 | | I10 | I31 | X | | | I12 |

INTERMODULATION COMPENSATION IN MULTI-CHANNEL AMPLIFIERS

This application is a divisional of application Ser. No. 08/764,877, filed Dec. 16, 1996, U.S. Pat. No. 5,933,766.

FIELD OF THE INVENTION

The present invention relates to the field of transmission systems that employ multiple transmitter power amplifiers to jointly amplify for transmission a multiplicity of signals, and more particularly to a method and apparatus for compensating intermodulation in multi-channel amplifiers.

BACKGROUND OF THE INVENTION

In a sectorized cellular system, just as in multi-beam communication satellites, groups of signals are to be transmitted in different directions or beams. In a three sector cellular base station conforming to AMPS or D-AMPS standards, for example, as many as twenty carriers per sector may need to be transmitted. The current method to transmit twenty carriers in each sector is to have effectively twenty single carrier transmitters and power amplifiers, the outputs of which are passively combined into a single antenna using either dissipative combiners (hybrid couplers), or multi-coupling filters. The former has the advantage of being able to combine carriers without regard to frequency spacing. Multi-coupling filters can only be built to combine 900 MHz signals with a 250 KHz guard space between them. Both methods are very lossy, compounded by the need to locate the hardware at the bottom of the mast to suffer a 3–6 dB cable loss. The resulting system is thus very expensive.

Consequently, there has been much discussion on the use of a common, multi-carrier transmitter power amplifier that could jointly amplify 20 carriers after combining at a lower level. The problem with this approach is intermodulation between the 20 carriers. Hitherto, specifications for intermodulation levels of −60 dB have been the aim. However, achieving −60 dB 3rd order intermodulation requires about 12 dB of input back-off, so that the power amplifier has to be designed for a saturated (peak) power of 16 times the mean power, leading to inefficiency. However, intermodulation from frequencies owned by one operator to other frequencies owned by the same operator does not need to be −60 dB.

FIG. 1 illustrates the difference between the traditional MCPA per sector and the Matrix power amplifier concept. As can be seen from FIG. 1, the Matrix power amplifier does not consist of separate amplifiers per sector, but rather jointly amplifies all 60 carriers. It is a 3-input, 3-output amplifier instead of the three, 1-input, 1-output amplifiers illustrated in FIG. 1a.

U.S. Pat. No. 3,917,998 to Welti entitled "Butler Matrix Transponder" describes an arrangement of N coupled power amplifiers for amplifying N signal paths. The N signal paths envisioned comprise the relaying of signals from at least one ground station to N locations on the earth using an orbiting satellite. The benefit of using coupled amplifiers over using a set of N non-coupled amplifiers is that the set of non-coupled amplifiers is limited to generating a power which does not exceed the peak power capability of a single amplifier in any signal path, whereas the technique which uses coupled amplifiers allows the generation of a power equal to the sum of the powers of all the amplifiers in any signal path, provided that all signal paths do not require higher than the mean power at the same time. As a result, signals that vary both above and below a mean power level are accommodated more efficiently due to a better statistical averaging of the power demanded by the N signal paths. The matrix power amplifier of the Welti patent is for use in frequency division multiple access (FDMA) applications, and provides the facility to vary the number of FDMA carrier frequencies used in each signal path and thus correspondingly the power needed in each signal path over a wide range.

A matrix power amplifier according to the Welti patent contains a butler matrix for combining a number N of input signals to be amplified to produce N different combinations of the input signals. In addition, a set of N power amplifiers are provided so that each amplifier amplifies one of the combinations to produce N amplified signals. The matrix power amplifiers also contain a butler matrix for combining the amplified signals to produce N outputs that are amplified versions of the original N input signals. The benefit as compared with simply amplifying the original N inputs in independent amplifiers is the ability, if instantaneously needed, to devote more than the power of a single amplifier to one of the N signal paths. In principle, the matrix power amplifier can deliver the sum of the power output of all amplifiers to a single output.

The characteristics of intermodulation generated by non-linearities in a matrix power amplifier are different than a single amplifier. It can be shown that third order intermodulation between signals input respectively to inputs I and J of the input butler matrix appears on the output numbers $(2i-j)_N$ and $(2j-i)_N$ of the output butler matrix. As a first step to reducing intermodulation in a matrix power amplifier, one embodiment of the present invention provides an excess number of amplifying paths so that outputs $(2i-j)$ or $(2j-1)$ or their corresponding inputs are not used for desired signal outputs, but are terminated in dummy loads. Thus, third order modulation between signals i and j will not be transmitted. This requires that the number of butler matrix input and output ports M be greater than the number of signals to be amplified N, wherein the remaining M-N signals are terminated in dummy loads.

In the matrix power amplifier disclosed in Welti, a butler matrix having a number of inputs and outputs equal to the number of signal inputs (N) forms N orthogonal linear combinations of the signals using passive combiners such as 180° and 90° hybrid or directional couplers. In the simplest example, a 2 input, 2 output butler matrix would take input signals S1 and S2 and form $(S1+S2)/\sqrt{2}$ and $(S1-S2)\sqrt{2}$. Elementary power amplifiers then amplify the orthogonal combinations, and then the amplified outputs are combined in an inverse coupler matrix to recover the amplified version of the individual signals S1, S2, . . . SN.

Thus, there is a need for a method and apparatus for reducing intermodulation distortion in a multichannel transmit amplifier array.

SUMMARY OF THE INVENTION

According to one embodiment of the invention, a multi-channel transmit amplifier array comprising a multiplicity N of coupled power amplifier elements is disclosed. The number of channels provided for amplifying desired signals for transmission is less than N, by at least one. In this case, the unused channel is used to inject an intermodulation compensation waveform specifically tailored to reduce intermodulation generated in all of the other N−1 signal paths. Instantaneous complex waveform values for the intermodulation compensation waveform may be systematically computed from the instantaneous complex values of the N−1 desired signals in such a way as to minimize the greatest signal amplitude in any of the N signal paths.

According to another embodiment of the invention, a method for reducing intermodulation distortion in a satellite communication system with an active phased array transmitting antenna which has a first plurality of elements and is capable of forming a first plurality of beams is disclosed. First, it is determined which beams are being used for transmission and which beams are inactive at a particular instance of time. Instantaneous complex waveform values for intermodulation compensation waveforms are then calculated from instantaneous complex values of transmission signals so as to minimize a greatest amplitude of signals in the beams being used for transmission. The intermodulation compensation waveforms are injected into the inactive beams so as to improve intermodulation distortion in the beams being used for transmission.

In yet another embodiment of the invention suitable for multichannel radio telephone application, it is common that on average half of the N transmissions will be silent in a given direction since the other party is talking. In this case, the present invention proposes injecting intermodulation compensation waveforms into the silent channels that may be systematically computed from the waveforms in the non-silent channels. Likewise, in an active phased array transmitting antennae of N elements being capable of forming N beams, intermodulation compensation waveforms are generated and used to excite the beams that are at any moment not used for communication. For multi-beam satellite communications in particular, intermodulation compensation waveforms may be injected into beam directions that do not intercept the earth. By improving intermodulation in this way, the transmitter amplifiers may be operated with less back-off and thereby higher efficiency.

BRIEF DESCRIPTION OF THE DRAWINGS

These and other features and advantages of the invention will be readily apparent to one of ordinary skill in the art from the following description, used in connection with the drawings, in which:

FIGS. 6–9 illustrate intermodulation outputs of a matrix power amplifier;

DETAILED DESCRIPTION

To mathematically evaluate power amplifier intermodulation it is necessary first to have a distortion model. If one is trying to linearize a power amplifier by predistortion, it is necessary to include both amplitude distortion and AM-PM conversion. However if one is merely trying to obtain realistic amounts of distortion and show how it varies with back-off, it is sufficient to use an amplitude distortion model.

The model used here is as follows. If (I,Q) represents complex input waveform points, then the complex output waveform is given by $$\left[ \frac{V_{sat}}{[V_{sat}^a + |I, Q|^a]^{\frac{1}{a}}} \right] \cdot (I, Q)$$

where Vsat represents the maximum (saturated) output voltage level that the amplifier can deliver, and "a" is an exponent to be determined.

Figure 1A:
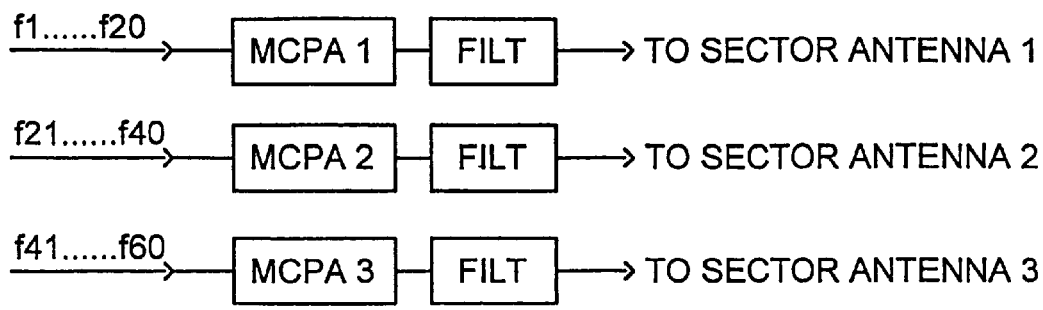
FIG. 1(a) illustrates a traditional multi-channel power amplifier.
Figure 1B:
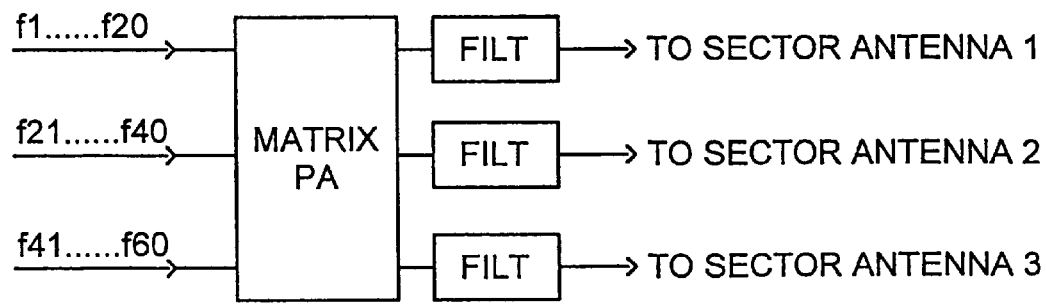
FIG. 1(b) illustrate a matrix power amplifier.
Figure 2:
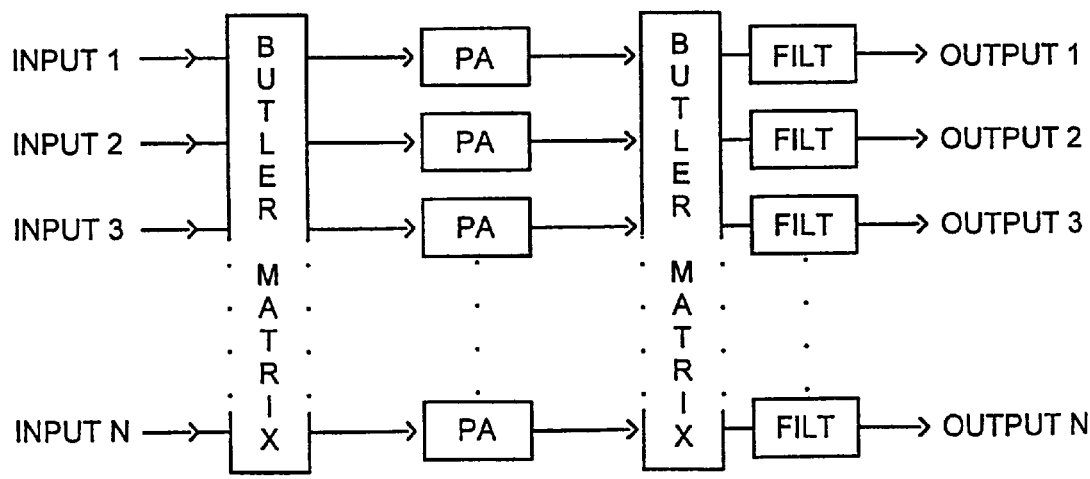
FIG. 2 illustrates a matrix power amplifier structure according to the prior art.
Figure 3:
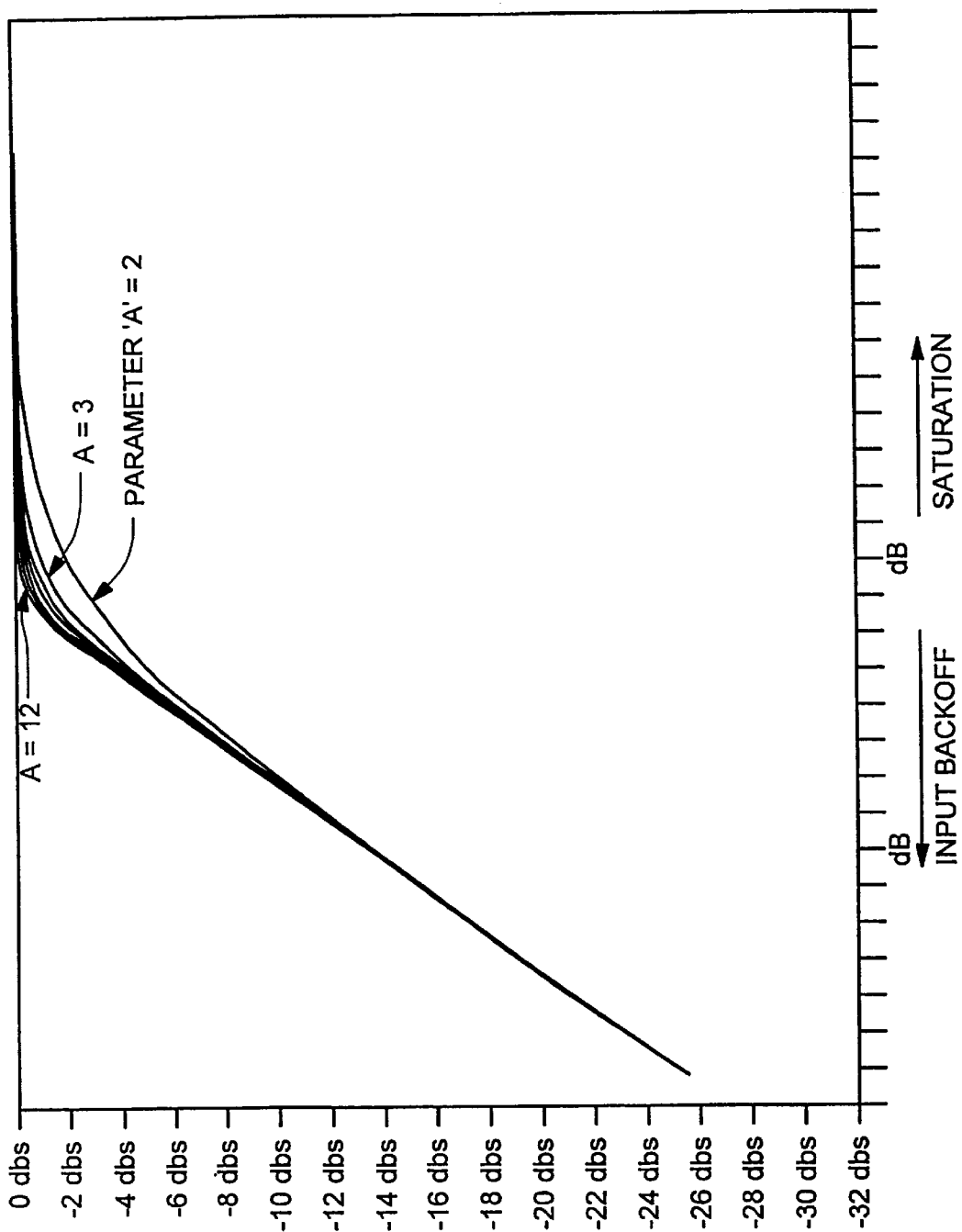
FIG. 3 illustrates power amplifier saturation models.

The above formula keeps the phase of (I,Q) unchanged but compresses the amplitude to a maximum of Vsat. The sharpness of the clipping depends on the exponent parameter 'a'. A low value of 'a', such as 2 or 3, means that the distortion onset is gradual and starts long before Vsat is reached, while a high value, such as 6 or 12, means that the amplifier is very linear until it hits saturation and then clips abruptly. The Pout/Pin curves are shown in FIG. 3 for 'a' ranging from 2 to 12. The parameter 'a' can also be related to the compression obtained when the drive power is equal to that which asymptotically would be expected to cause the power to reach maximum. This input drive level is termed the "zero dB input backoff point".

At zero dB input backoff, the compression versus the value of the parameter 'a' is as follows:

| a  | output power compression |
|----|--------------------------|
| 2  | 3 dB                     |
| 3  | 2 dB                     |
| 6  | 1 dB                     |
| 12 | 0.5 dB                   |

For a power amplifier that is not linearized by sophisticated techniques, a compression of 1–2 dB is expected, i.e., 'a'=3–6. For a power amplifier that has been linearized by, for example, Cartesian feedback, a high value of 'a' would be expected because it is held linear by feedback until the power hits the ceiling.

The saturation models of FIG. 3 can be used to compute the intermodulation for a single multichannel power amplifier fed with the sum of 20 equal carriers. Intermodulation is computed by filling a spectrum with the 20 carriers in chosen spectral bins and zeros elsewhere and then inverse Fast Fourier Transforming the spectrum to obtain I,Q waveforms. The I,Q waveforms are then subjected to the above distortion formula. The distorted I,Q waveforms are then Fast Fourier Transformed to obtain the spectrum of signals plus intermodulation. Intermodulation on top of a signal is calculated by leaving out one of the 20 signals at a time and determining how much intermodulation power falls in the slot. This is then averaged over many trials with random signal phases and over all slots to obtain the curves illustrated in FIG. 4.

Figure 4:
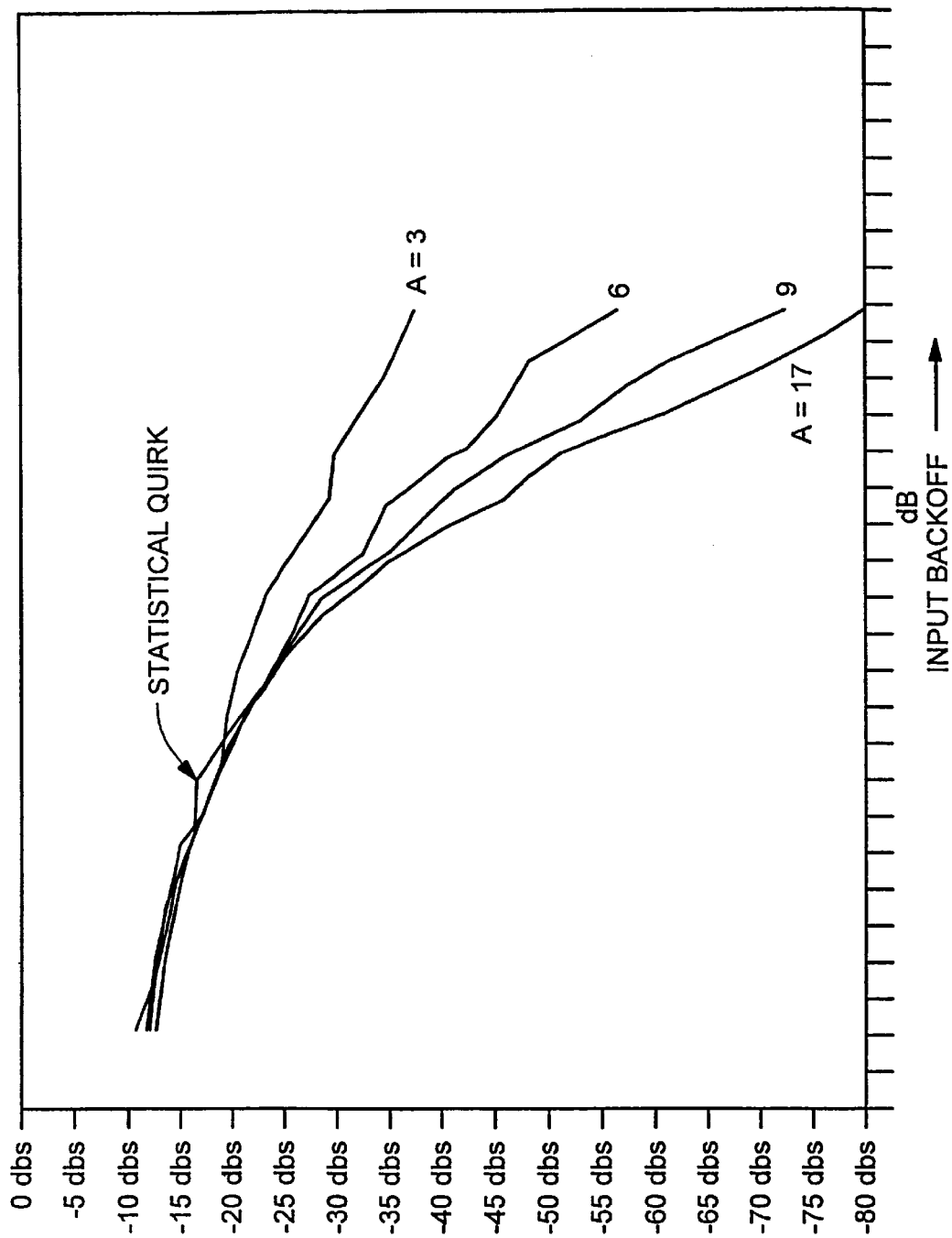
FIG. 4 illustrates intermodulation versus back-off for a single channel multi-channel power amplifier.

FIG. 4 shows that for hard-driven amplifiers and intermodulation levels greater than −20 dB, the value of the linearity parameter 'a' is not so critical. There is in fact a reverse relationship between intermodulation and linearity, the preference being for gradual onset of clipping. For low intermodulation (<−25 dB) however, a high 'a' value, representing a sudden onset of clipping, is preferable. The 'a' value of an amplifier may be increased by the use of negative feedback or pre-distortion to linearize the amplifier as far as possible right up to the saturated output level. If a −60 dB intermodulation performance is indeed needed in-band, a linearity parameter value of a=3 may never allow it to be met with reasonable backoff, and the difference between a=6 and a=12 for a intermodulation of −60 dB is a backoff of approximately 12 dB compared to 9 dB. An amplifier with 9 dB of backoff is at least 1.4 times and probably twice as efficient as one with 12 dB of backoff. The whole issue of joint amplification of signals can thus be described as meeting required intermodulation levels with minimum backoff and thus highest efficiency.

Figure 5:
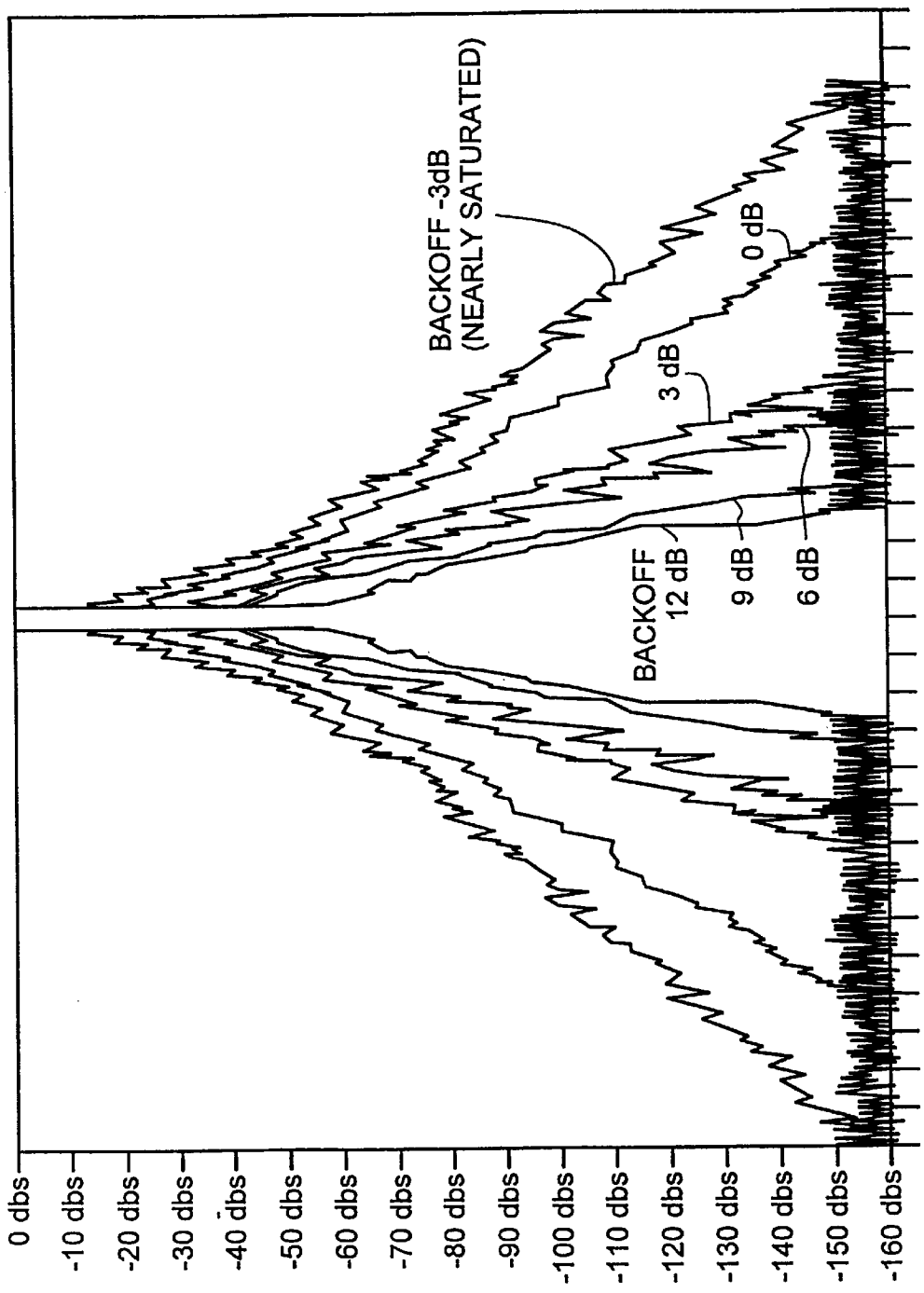
FIG. 5 illustrates intermodulation spectra for a 20 carrier multi-channel power amplifier for various amounts of input back-off.
Figure 10:
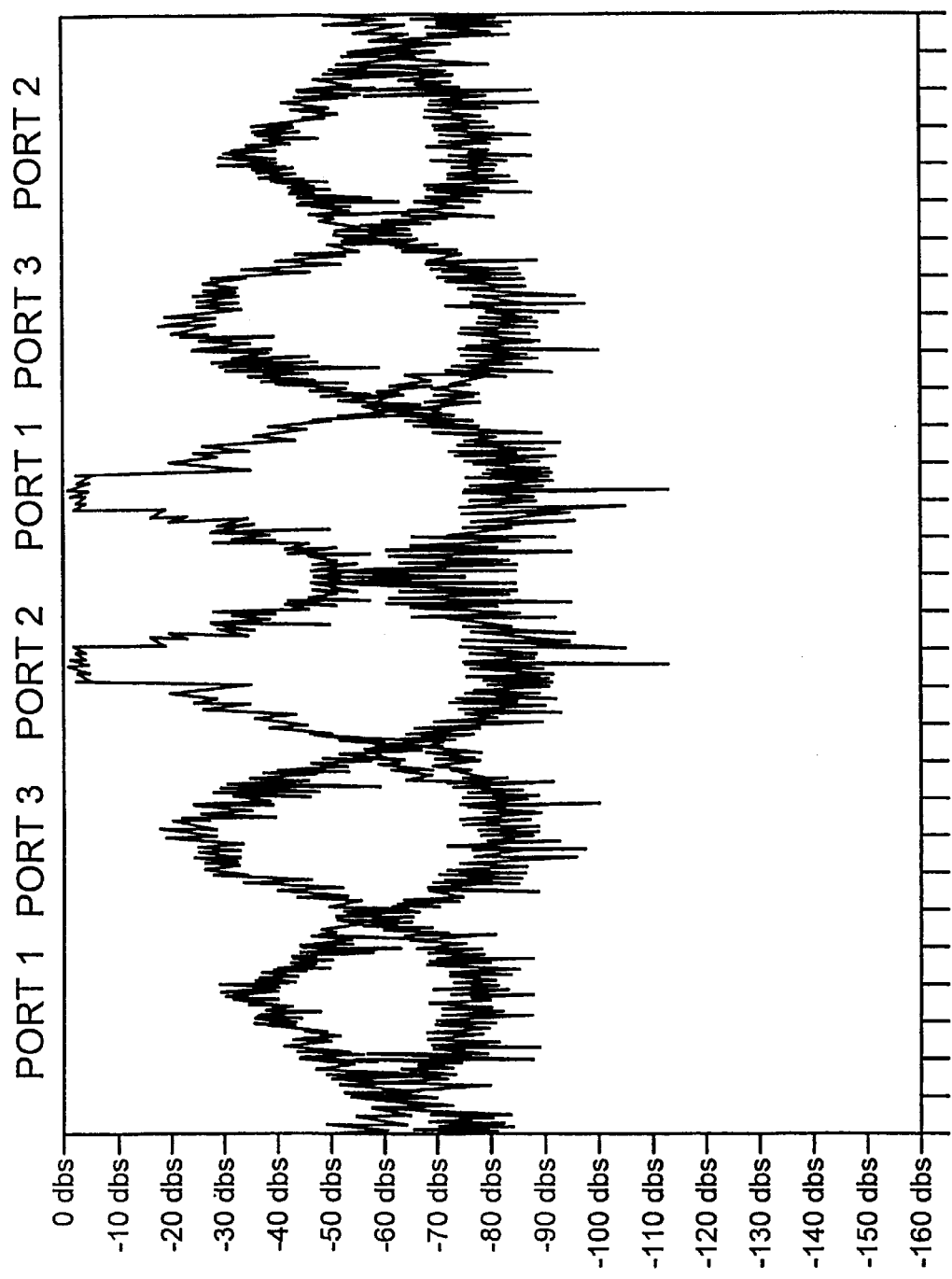
FIGS. 10–13 illustrate how third order intermodulation appears on unused ports of a 3-channel power amplifier.
Figure 11:
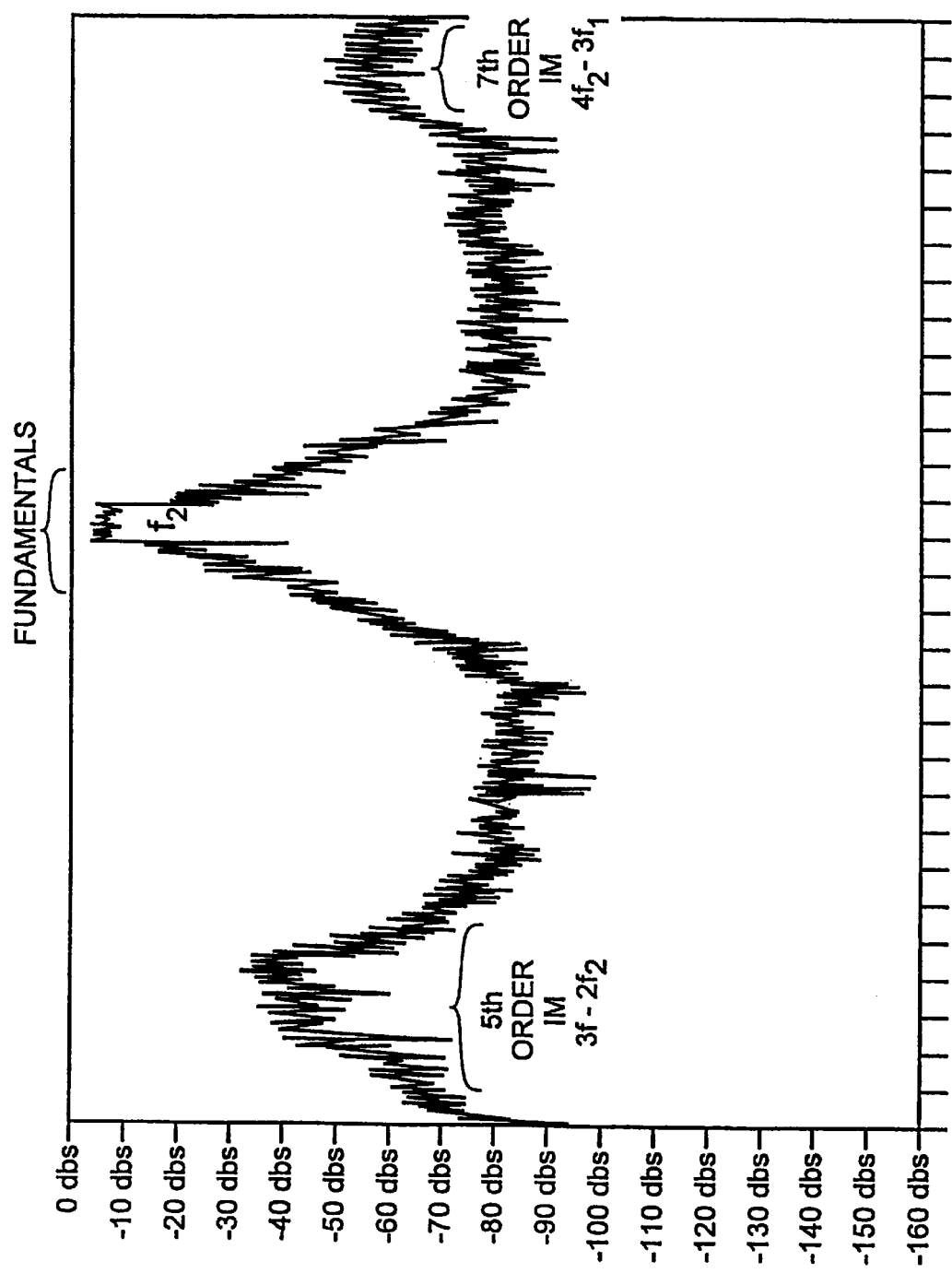
Figure 12:
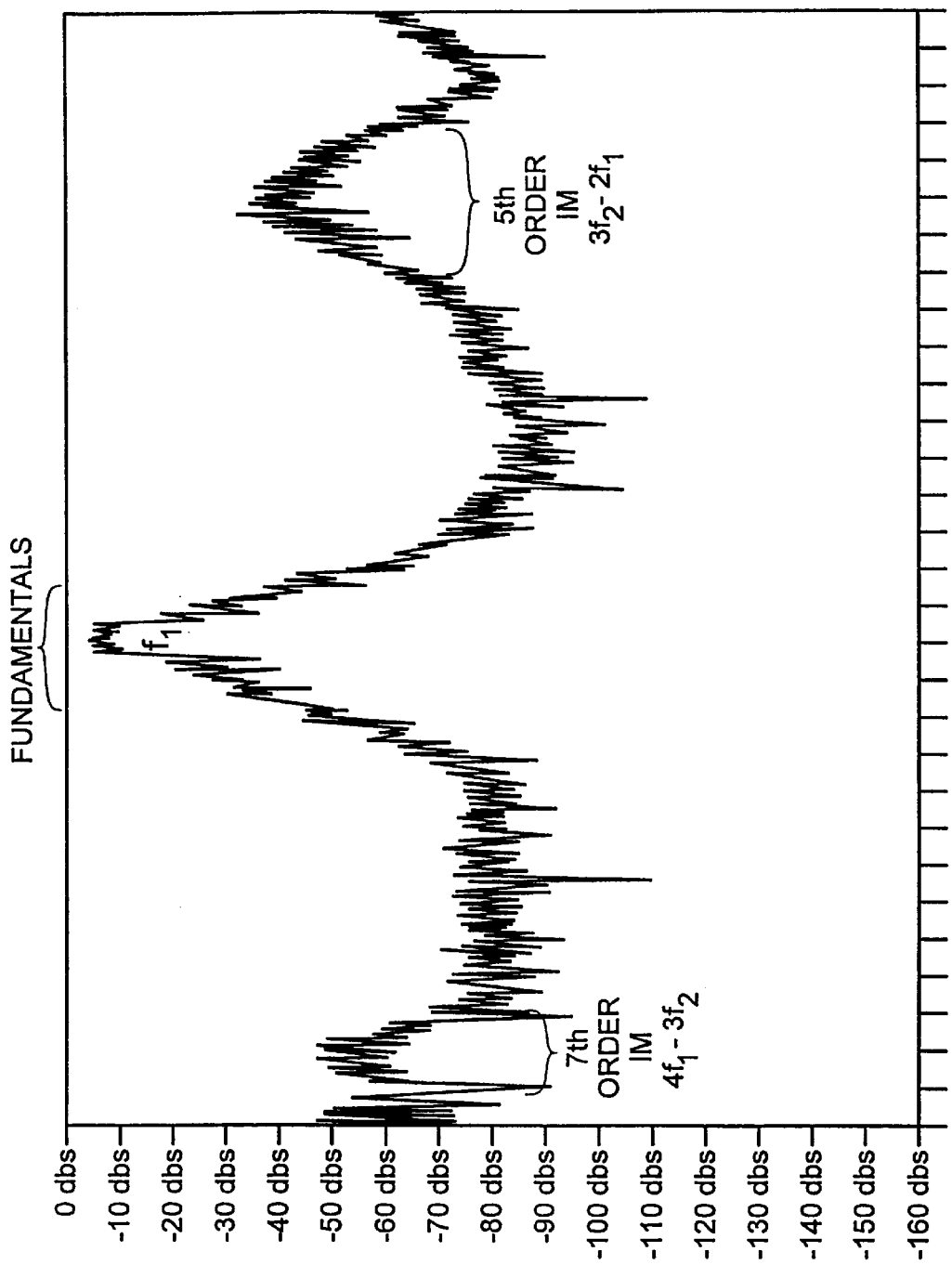
Figure 13:
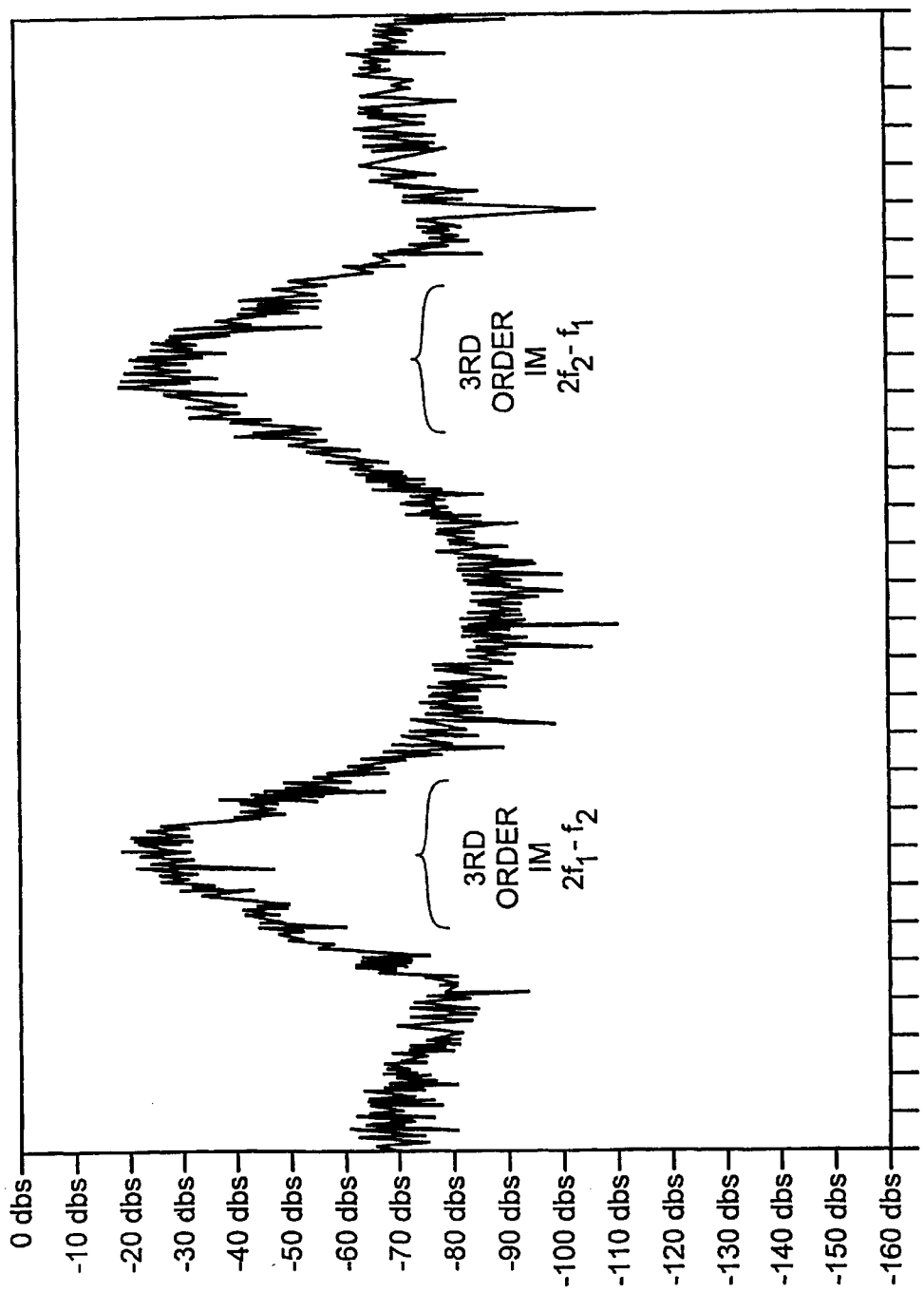

FIG. 5 shows the spectrum that a single multichannel power amplifier (a=6) generates with different amounts of input backoff. FIG. 5 indicates that, for a multichannel power amplifier with −40 dB in-band intermodulation, the bandwidth at −60 dB is about three times the wanted signal span, in the absence of further filtering. This could of course be reduced by a bandpass filter, depending on the sharpness of its cutoff.

FIG. 6 shows diagrammatically which amplifier ports are used for amplifying which frequency bands. An X in the frequency columns 901 and 902 MHz and in the row corresponding to port 1 shows where a particular wanted signal lies. In this case, 3rd order intermodulation between 901 and 902 MHz arises at 2F1-F2 and 2F2-F1 at 900 and 903 MHz, respectively. Intermodulation between signals in the same channel arises in the same channel however, so the IP3 products also lie in port 1.

FIG. 7 shows where the intermodulation between same-frequency signals applied to different matrix power amplifier ports falls. The X-s indicating wanted signals are in this case both in the 901 MHz column, but in channels 1 and 2. 3rd order intermodulation in this case occurs at 2F1-F2 and 2F2-F1, which are both again 901 MHz, but appears at output ports 2P1-P2 and 2P2-P1, i. e., 2(1)−2=0 and 2(2)−1=3. The third order modulation products are therefore shown in the same frequency column but at ports 0 and 3. The fifth order modulation products likewise fall in ports 3P1-2P2 and 3P2-2P1, i. e., in ports -1 and 4. If there are no ports -1 or 4, the port number must be reduced modulo the number of ports to find out where the intermodulation product falls. In the case of a four-channel matrix power amplifier, port 4 would be the same as port 0 and port -1 would be the same as port 3. Therefore fifth order intermodulation products also emerge from ports 0 and 3 along with third order intermodulation products. The lowest order intermodulation products that fall in the same channels as the two wanted signals are 7th order. Unfortunately this only refers to intermodulation between the signals on different ports. Intermodulation between multiple signals on the same port, as explained with reference to FIG. 6, comes out of the same port. Nevertheless, a proportion of the intermodulation on wanted signal frequencies in the signal ports of FIG. 7 is directed to unused ports, diluting the remaining intermodulation.

FIG. 8 illustrates different signal frequencies applied to different ports. In FIG. 8, the Xs corresponding to wanted signals are at 901 MHz on port 1 and 902 MHz on port 2. The third order intermodulation products at 2F1-F2 (900 MHz) emerge from port 2P1-P2=0 and the IP3s at 2F2-F1 (903 MHz) emerge from port 2P2-P1=3. In calculating where higher order intermodulation products emerge, the port numbers have been reduced modulo 4. It can be seen from FIG. 8 that neither 3rd nor 5th order intermodulation appears on the same port as the wanted signal. The first intermodulation order to appear on a wanted signal output is 7th order intermodulation. It would appear relatively easy to filter away the 7th order intermodulation at 905 MHz from port 1 or at 898 MHz from port 2, as the frequency separation is increased.

FIG. 9 shows how all four ports of a 4-channel matrix power amplifier can be used for wanted signals by cunning allocation of frequency bands to channels. The location of intermodulation caused by any pair of port signals shows that no 3rd order intermodulation between port signals falls on a wanted signal frequency.

In general, the high total amplifier power needed for a complete 3-sector, 20-carriers per sector AMPS or DAMPS base station would be created by combining a number of lower power amplifiers. There is no need to restrict the number of amplifiers and channels of a matrix power amplifier to be equal to the number of sectors. The number of channels for 3-sectors could be 8, for example, giving 5 unused channels into which intermodulation can be intelligently directed. The total power need not be increased; it is just divided between 8 smaller amplifiers instead of 3 larger ones, which is also practically desirable.

The choice of the ports to use so that intermodulation between any two ports falls into unused ports is exactly the same problem as the choice of frequency spacings in a non-linear satellite transponder such that third order intermodulation between any two frequencies does not fall on a wanted frequency. Such frequency spacings are called Babcock spacings. The Babcock spacing of three wanted signal ports in an 8-channel matrix power amplifier is shown below:

| PORT 0 | 1 | 2 | 3 | 4 | 5 | 6 | 7 |
|---|---|---|---|---|---|---|---|
| — | X | — | X | — | — | X | — |

It may be verified that no third order intermodulation between any pair of drive ports marked "X" falls on another used port, but rather on an unused port marked "-". This desirable situation pertains even when the three X's represent the same signal frequency band.

It has been shown above how the matrix power amplifier offers two degrees of freedom to escape from intermodulation problems, namely choice of frequencies in the frequency domain combined with choice of ports in a spatial connection domain.

FIGS. 10–13 illustrate for a 3-channel power amplifier with two driven ports how third order intermodulation appears on the unused port. The power amplifiers for these figures were driven with around 0 dB of backoff to make the intermodulation clear.

Further possibilities exist to reduce intermodulation when the channels of a matrix power amplifier are deliberately underutilized. An arbitrary signal may be injected into any unused channel as it will appear in a dummy load at an unused output. However, the arbitrary signal affects all instantaneous signals at all power amplifiers. It may therefore be chosen from time instant to time instant to reduce the instantaneous drive amplitude at the worst (most heavily driven) power amplifier and thus hope to reduce all IM. Such a waveform is termed an IM compensating waveform and may be systematically computed by the Minimax method. The table below shows the reduction in IM when applying such a waveform to the 8th port of an 8 channel matrix power amplifier (a=6) with 7 channels used for wanted signals.

TABLE 1

IM WITH 7 OUT 8 CHANNELS LOADED AND A
MINMAX FORCING WAVEFORM INJECTED AT PORT 8

| BACKOFF | SIGNAL SPECTRA AT ALL PORTS OVERLAP | | SIGNAL SPECTRA AT DIFFERENT PORTS DO NOT OVERLAP | |
| --- | --- | --- | --- | --- |
| | WITHOUT MINMAX FORCING | WITH MINMAX FORCING | WITHOUT MINMAX FORCING | WITH MINMAX FORCING |
| −3 dB | −12.78 dB | −13.62 | −17.4 | −17.44 |
| 0 | −15.57 | −16.71 | −19.51 | −19.53 |
| 3 | −20.33 | −22.37 | −24.56 | −25.17 |
| 6 | −27.83 | −31.51 | −32.45 | −34.51 |
| 9 | −39.92 | −45.65 | −43.91 | −48.34 |
| 12 | −55 | −62.83 | −59.36 | −65.00 |

The above table indicates about a 5 dB advantage for minmax forcing with a single unused port at the −60 dB level and about 3 dB at the −40 dB IM level. This table also illustrates a significant improvement at the higher IM levels (for 3 dB of backoff) for the matrix power amplifier (−25.17 in the last column) compared to the MCPA's 22 dB (see FIG. 4). It is probable that D-AMPS could easily tolerate an in-band IM level of −25 dB, as the IM fades in sync with the wanted signal and does not cause so much degradation. Thus, if the out-of-band IM can be reduced to an acceptable level, an MPA for a D-AMPS base station may be able to operate with as little as 3 dB of backoff, at which point efficiencies of 30% ought to be possible. The IM advantage continues to increase with an increase in the number of MPA channels, and the significant improvements in IM at the −60 dB level will be much greater if more than one minmax forcing waveform is applied to more than one unused port.

Figure 14:
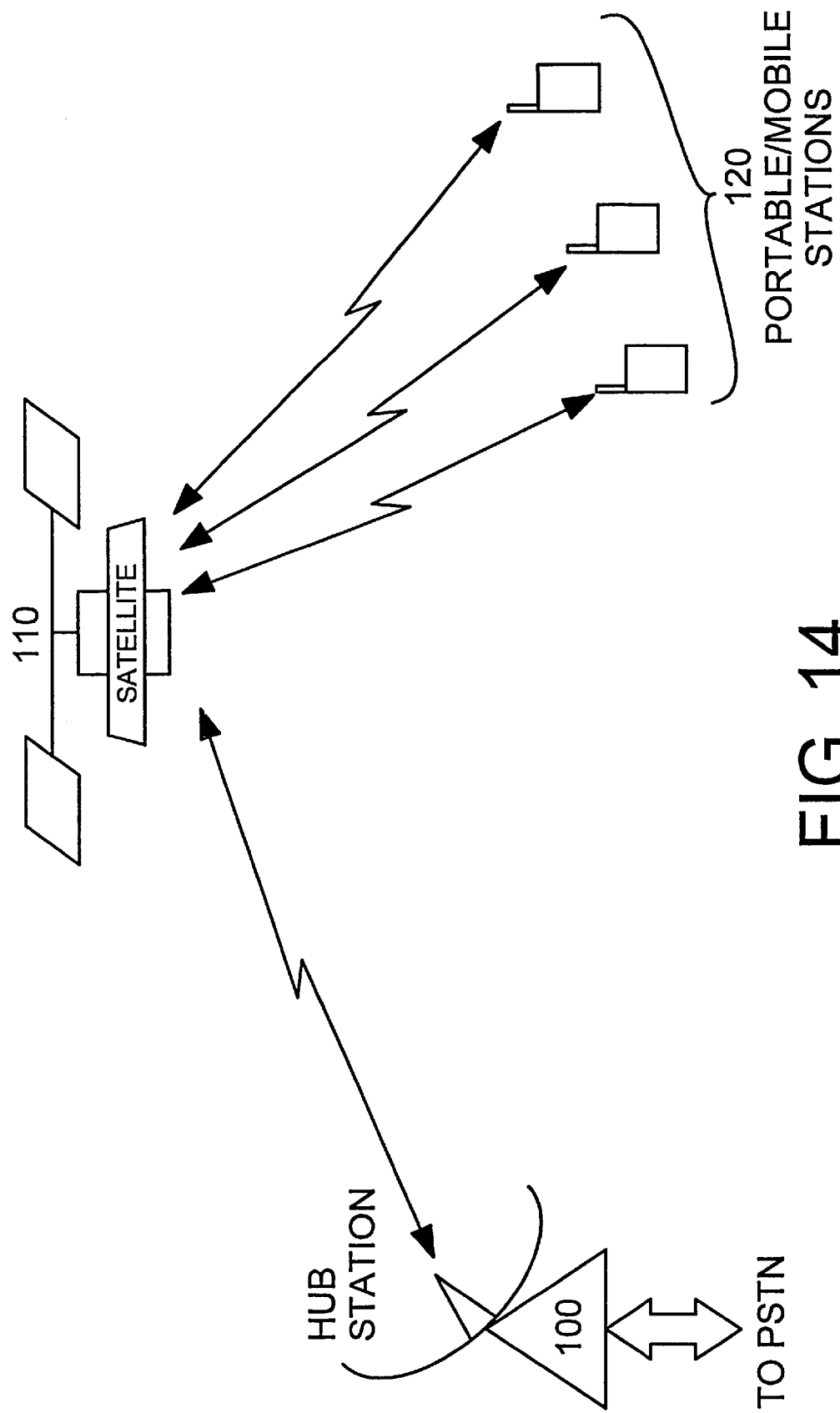
FIG. 14 illustrates a satellite communication system.

As noted above, the present invention can also be applied to satellite communication systems. A satellite communication system is illustrated in FIG. 14. A more detailed description of a suitable satellite communication system is described in U.S. patent application Ser. Nos. 08/179,953 and 08/179,947, which are incorporated herein by reference. FIG. 14 illustrates a plurality of mobile radio telephones 120 in communication via satellite 110 with a hub station 100. The hub station is connected, for example, via a local exchange, to the public switched telephone network PSTN to allow calls to be placed between the portable phones and any telephone subscriber worldwide, as well as between the satellite phones. The satellite relays signals to the mobile phones and the hub station using a plurality of beams generated by an active phased array transmitting antenna which has N elements and is capable of forming N beams. In this embodiment, the system calculates instantaneous complex waveforms from instantaneous complex values of transmission signals, in the manner described above, so as to minimize a greatest amplitude of signals in the beams being used for transmission. The intermodulation compensation waveforms are injected into the inactive beams so as to improve intermodulation distortion in the beams being used for transmission. In addition, the intermodulation compensation waveforms are injected into beams which are not directed towards the earth.

It has thus been shown that intermodulation may be reduced by practicing the improvements to Welti's Matrix Power Amplifier disclosed above. The first improvement comprises overdimensioning the number of channels of coupled amplifiers provided in relation to the number of channels of signal amplification desired, the wanted channels being selected such that intermodulation falls into the extra channels and is thus dissipated in dummy loads. Equivalently, in a phased array satellite having a number of active transmitting antenna elements exceeding the number of beams desired to illuminate the earth, an additional number of beams may be formed that do not illuminate the earth. Some portion of the intermodulation may then be caused to fall in the extra beams that do not intercept the earth, thus dissipating the intermodulation into space.

The second improvement described above comprises actively driving the extra channels with specially generated intermodulation compensation waveforms instead of leaving the extra channels undriven. The intermodulation compensation waveforms are themselves amplified but the amplified waveforms are dissipated in dummy loads attached to the unused output ports or, in the case of an overdimensioned phased array satellite, are harmlessly radiated into beams that do not intercept the earth.

Figure 15:
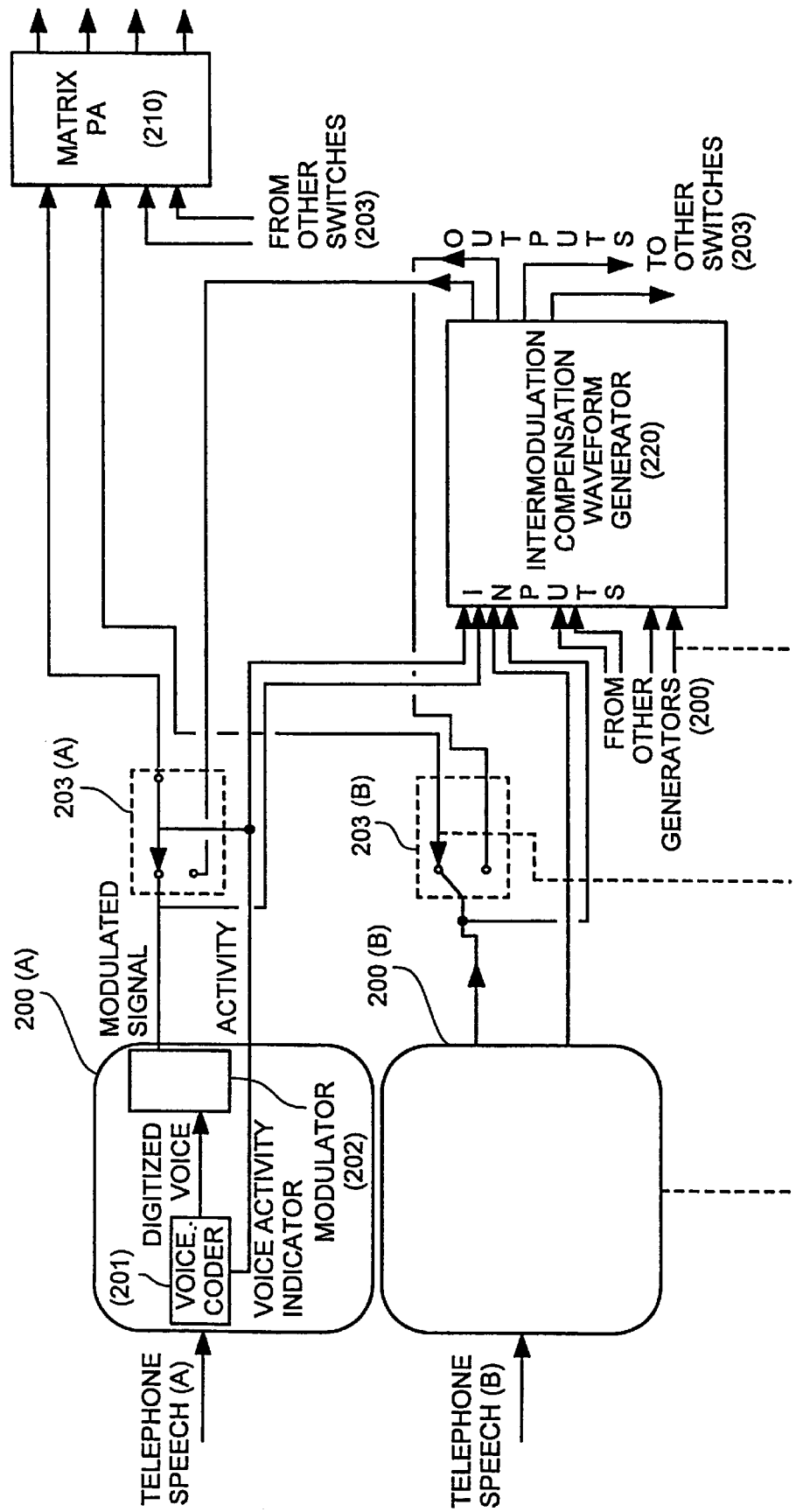
FIG. 15 illustrates a Matrix Power Amplifier exploiting DTX according to one embodiment of the present invention.

A third implementation of the invention will now be described, adapted to amplify a multiplicity of radiotelephone signals for transmission wherein half of said signals are statistically liable to be silent at any given instant in time. It is well known that, in a two-party telephone conversation, one party is generally silent while the other party is talking, leading to a 50% speech activity factor when averaged over many conversations. FIG. 15 illustrates a number of radiotelephone signal generators 200 comprising a voice coder to digitize, compress and error correction code a telephone signal, a modulator 202 to impress the coded, digital voice signal on to a radio frequency carrier for transmission, the voice coder also providing a voice activity signal indicative of speech or no speech. A switch 203 associated with each generator 200 is operated by the associated voice activity indicating signal to select either the speech modulated radio signal from the modulator 202 or, during speech pauses, to select an intermodulation compensation waveform from an IC waveform generator 220. The IC waveform generator 220 computes at least one, but preferably a plurality of IC compensating waveforms that are a function of the active speech modulated signals, as indicated by the activity indicating signals that are also supplied to unit 220. The method of computing the at least one IC waveform from the active signals is as follows.

First, let the instantaneous phase and amplitude of active radio signal index k be denoted by the complex number Z(k). Furthermore, the indices of the active signals are denoted by k1,k2,k3 . . . and Z(k) equals zero for k equal to the indices of inactive signals.

The instantaneous phase and amplitudes of the drive signals to the power amplifiers of the matrix PA are computed by computing the FFT of the array of values Z(k), denoting the result by Z'(k). Then, the instantaneous value Z(i) of an intermodulation compensating waveform (where i does not equal any of k1,k2,k3 . . . ) is computed such that the largest value, over all k, of $|Z'(k)+Z(i).EXP(j2Pi.ik/N)|$, i.e., the power amplifier instantaneous drive signal amplitude, is minimized. Finally, successive values of Z(i) describe the phase and amplitude of the IC radio signal that shall be injected into temporarily inactive channel i through selection by switch 203 in the i'th channel.

The above procedure is called a MINMAX computation because it minimizes whatever turns out to be the maximum of a number of quantities. Inevitably, two of the results end up being equal, the process terminates because any change to Z(i) would result in one value increasing and the other decreasing, or vice versa.

The above process and FIG. 15 are illustrative only and variations that are more practical can be readily understood by one skilled in the art. In particular, it will be realized that the modulator 202 would best first compute the complex values Z(k) in numerical form used by the IC waveform computer 220. The latter would numerically compute Z(i) likewise; then, the selected Z(k) values would be applied to quadrature modulators to impress them on the radio carrier frequencies. The radio carrier frequencies in different channels may be the same or different. When they are different, their relative frequency differences must be accounted for by ascribing an appropriate continuous phase rotation to successive Z(k) values, in addition to any phase and amplitude modulation produced by the speech signal.

Figure 16:
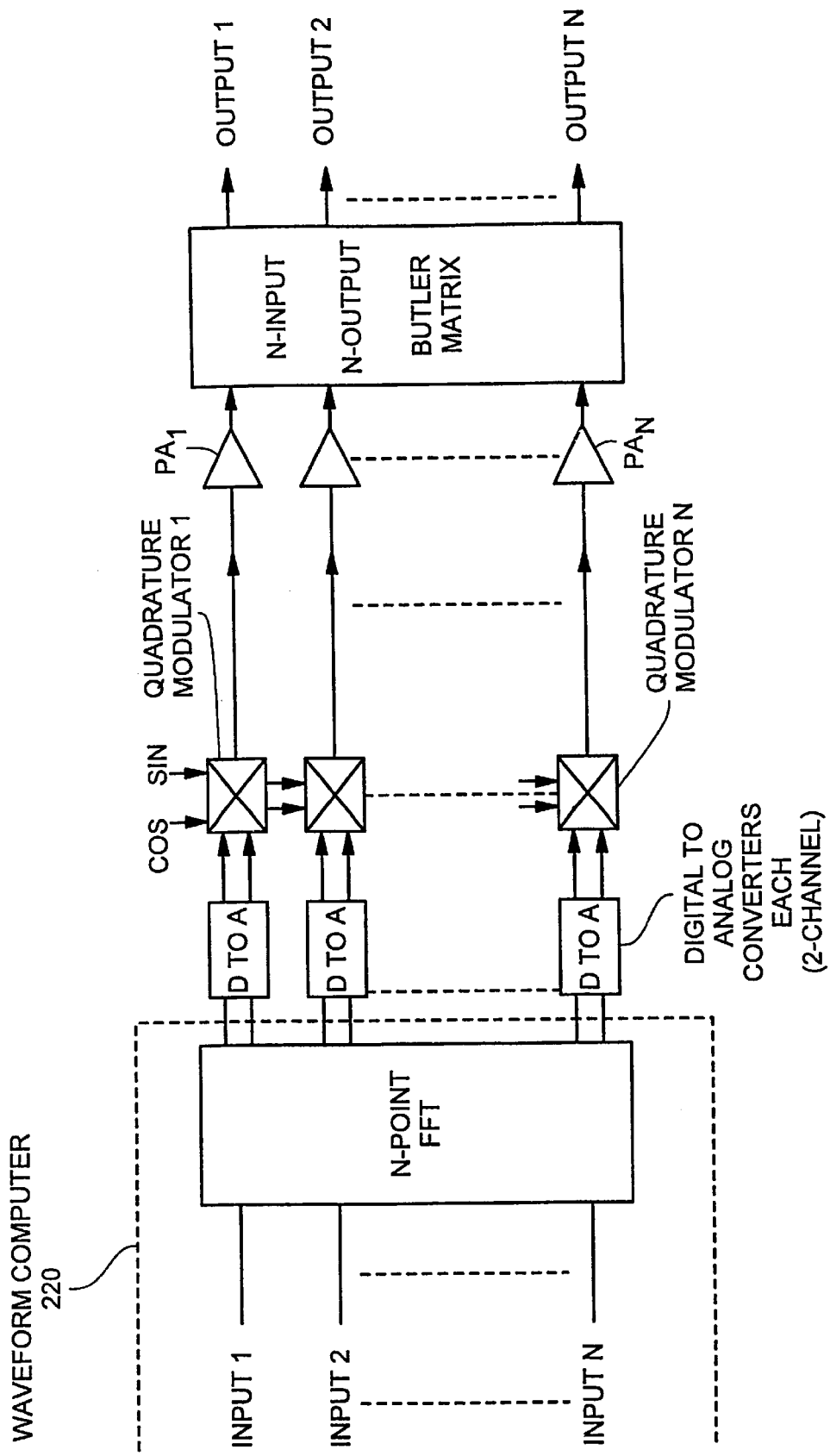
FIG. 16 illustrates a Matrix Power Amplifier with a digital input matrix according to one embodiment of the present invention.

Since the FFT of the Z(k) values, Z'(k) are computed in the IC waveform computer 220 in order numerically to mimic the operation of the input Butler matrix of matrix PA 210 and thus compute the PA drive signals, another variation of the invention is to output the signals $$Z'(k)+Z(i).EXP\ (j2Pi.ik/N)$$

to a set of quadrature modulators to produce power amplifier drive signals directly, omitting the input Butler matrix. This alternative is illustrated in FIG. 16. In this alternative, the operation of the input Butler matrix has been performed by the numerical processing in the IC waveform computer 220, which has the advantage of reducing imperfections in the quadrature modulators as well as intermodulation in the power amplifiers.

In the event that more than the "at least one" IC compensating signal is to be generated, one method is to apply the above procedure iteratively to compute first Z(i1), which is then regarded as an extra active signal in computing Z(i2), and so forth. This does not provide the optimum intermodulation cancellation that would be obtained by performing a full vector MINMAX computation, but may be simpler to implement. In the full MINMAX computation, the complex vector $$\hat{Z}=\{Z(i1);Z(i2);Z(i3)\ldots(Z(im)\}$$

must be found to minimize the largest PA drive signal, and inevitably results in '2m' drive signals being of equal magnitude, the process terminating when any change to the vector $\hat{Z}$ would result in one or other of the drive signals increasing in magnitude.

A special case exists when m=N/2; then, in principle all drive signals can be forced to be of equal magnitude, reproducing the invention disclosed in U.S. patent application Ser. No. 08/179,947 in which a set of 2N constant envelope amplifiers is used to amplify N non-constant-amplitude signals.

It will be appreciated that, for large N where the voice activity averaged over all N channels becomes statistically closer to 50%, the device of this invention approaches that regime, in which all PA's are caused to run at approximately constant amplitude. Those channels which are active and those which are inactive and used for injecting IC waveforms are however continually changing with varying speaker activity, to which the current invention adapts by varying the operation of IC waveform generator 220 according to the voice activity indications.

It will be appreciated by those of ordinary skill in the art that the present invention can be embodied in other specific forms without departing from the spirit or central character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An apparatus for reducing intermodulation distortion during a radiotelephone communication, comprising:

a plurality of generators each comprising a voice coder for digitizing, compressing and error correction coding a voice signal, said voice coder also providing voice activity signal indicative of the presence or absence of speech;

modulation means for impressing the coded, digital voice signal on a radio frequency carrier for transmission;

a waveform generator for computing at least one intermodulation compensation waveforms that are a function of the active speech modulated signals; and a switching means operated by said voice activity indicating signal for selecting either the speech modulated radio signal from said modulation means when speech is present and for selecting an intermodulation compensation waveform from said waveform generator during speech pauses.

2. A method for reducing intermodulation distortion during a radiotelephone communication, comprising the steps of:

digitizing, compressing and error correction coding a voice signal in a plurality of generators;

producing a voice activity signal indicative of the presence or absence of speech;

impressing the coded, digital voice signal on a radio frequency carrier for transmission;

computing at least one intermodulation compensation waveforms that are a function of the active speech modulated signals; and selecting either the speech modulated radio signal from said modulation means when speech is present and for selecting an intermodulation compensation waveform from said waveform generator during speech pauses depending upon the voice activity indicating signal.

* * * * *